United States Patent [19]

Mar

[11] 3,765,961

[45] Oct. 16, 1973

[54] SPECIAL MASKING METHOD OF FABRICATING A PLANAR AVALANCHE TRANSISTOR

[75] Inventor: Jerry Mar, Scotch Plains, N.J.

[73] Assignee: Bell Telephone Laboratories, Incorporated, Murray Hill, N.J.

[22] Filed: Feb. 12, 1971

[21] Appl. No.: 114,861

[52] U.S. Cl..................... 148/175, 29/578, 117/201, 117/212, 148/187, 317/235 R

[51] Int. Cl.......... H01l 7/44, H01l 3/00, H01l 15/00

[58] Field of Search..................... 148/1.5, 174, 175, 148/187; 317/234, 235; 117/201, 212; 29/578

[56] References Cited

UNITED STATES PATENTS

| | | | |
|---|---|---|---|
| 3,456,168 | 7/1969 | Tatom | 317/235 |
| 3,345,221 | 10/1967 | Lesk | 148/175 |
| 3,347,720 | 10/1967 | Bryan et al. | 148/187 |
| 3,457,469 | 7/1969 | Lawrence | 317/234 |
| 3,514,846 | 6/1970 | Lynch | 29/578 X |
| 3,566,218 | 2/1971 | Widlar et al. | 317/235 |
| 3,328,214 | 6/1967 | Hugle | 148/175 |
| 3,477,886 | 11/1969 | Ehlenberger | 148/187 |
| 3,490,962 | 1/1970 | Duffy et al. | 148/187 |
| 3,534,232 | 10/1970 | Weinerth | 317/234 |
| 3,585,464 | 6/1971 | Castrucci et al. | 317/235 |
| 3,477,123 | 11/1969 | Barson et al. | 29/578 |

OTHER PUBLICATIONS

Magdo et al. "Ultra High Speed Transistor" IBM Tech. Discl. Bull. Vol. 13, No. 6, Nov. 1970, p. 1423–1424.

Berger et al. "Semiconductor Structure" IBM Tech. Discl. Bull., Vol. 13, No. 1, June 1970, p. 295.

*Primary Examiner*—L. Dewayne Rutledge
*Assistant Examiner*—W. G. Saba
*Attorney*—W. L. Keefauver

[57] ABSTRACT

An avalanche junction transistor is fabricated by growing on an n+—type substrate an n-type epitaxial layer, masking all but a central region of the epitaxial layer, converting the central region of the epitaxial layer to p-type material, substantially increasing the diameter of the aperture in the mask and converting a portion of the p-type material to n+—type material. Connections are provided to the central n+—type region and the *n*-type epitaxial layer. Accordingly, the surface portion of the resulting p-n+ junction is located in a region of relatively low impurity concentration; consequently, avalanche breakdown is restricted to a region below the surface of the junction, thereby avoiding surface breakdown that would otherwise degrade transistor performance.

4 Claims, 6 Drawing Figures

INVENTOR
J. MAR
BY
[signature]
ATTORNEY

SPECIAL MASKING METHOD OF FABRICATING A PLANAR AVALANCHE TRANSISTOR

BACKGROUND OF THE INVENTION

This invention relates to a fabrication of semiconductive devices which contain a p-n junction that is operated in avalanche breakdown. This invention is particularly applicable to the production of avalanche transistors useful as memory cells.

In a p-n diode, such as the emitter-base junction of the n-p-n transistor of copending application Ser. No. 103,167, filed Dec. 31, 1970 (D. J. Lynes-J Mar. Case 10-4), when a sufficiently large reverse-bias is applied to the junction it breaks down and conducts in the reverse direction. This characteristic is known as avalanche breakdown. Typically, junctions of this type are formed by the diffusion, through apertures in masks, of impurities able to convert the conductivity of the diffused region. The resulting junction is characterized by a planar central portion and a curved surrounding edge portion which extends to the surface. This geometry of the junction favors the occurrence of breakdown at the surface or at the curved edge of the junction. It can be shown that such breakdown at the surface tends to degrade the performance of the junction and therefore transistor performance.

Various techniques have been suggested to prevent breakdown at the surface of a p-n junction avalanche device. Typical is that described in U.S. Pat. Nos. 3,514,846 and 3,345,221. Both of these patents teach the technique of using a p-type layer on top of a p+—type layer to increase the reverse breakdown potential at the surface of the device in order to force breakdown to occur below the surface. Both use at least two separate oxide masking steps and two diffusing steps to fabricate a diode. Extending these techniques to the fabrication of an avalanche transistor would require three or more separate masking and diffusing steps. These relatively complicated fabrication processes are undesirable in many instances since they would add substantially to the cost of the circuits produced.

An object of this invention is an avalanche junction transistor, particularly useful as a memory cell, which avoids the tendency to surface breakdown and requires a relatively few number of fabrication steps.

SUMMARY OF THE INVENTION

These and other objects of the present invention are achieved by the use of a method for fabricating a transistor such that the concentration of impurities at the surface of the p-n junction is significantly smaller than in the flat bulk region of the junction. Thus, when a high reverse voltage is applied across the junction, the avalanche breakdown occurs below the surface and therefore repeated breakdown does not degrade transistor performance.

In one embodiment of the invention, an avalanche transistor is fabricated using an oxide mask having an aperture through which both the base and emitter diffusions are made. After the base diffusion, the lateral extent of the aperture is increased and then the emitter diffusion is made. The increase in lateral extent of the aperture causes the surface region of the emitter-base junction to form in a region in which impurity concentration is lower than that along the flat bulk region of the junction and therefore avalanche breakdown occurs below the surface region of the emitter-base junction.

The increased aperture opening causes the surface region of the emitter-base junction to be formed closer to the collector of the transistor than would be the case if the aperture had not been increased before emitter diffusion. This tends to lead to increased emitter-collector shorts. In order to increase protection against emitter-collector shorts without increasing the effective base width, an n-type epitaxial layer is deposited on an n+—type substrate and then a p-type base is diffused completely through the epitaxial layer into the n+—type substrate. As will be made clear later, this results in a greater base lateral diffusion than vertical diffusion, thereby affording more distance between the emitter and the collector which decreases the possibilities of emitter-collector shorts without increasing the effective base width.

These and other objects, features, and advantages of the invention will be better understood from a consideration of the following detailed description taken in conjunction with the accompanying drawing.

DETAILED DESCRIPTION OF THE DRAWING

Figure 1:
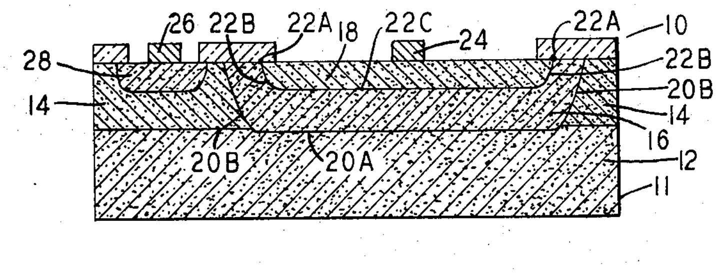
FIG. 1 shows in cross section a transistor fabricated in accordance with the invention.

In the transistor 10 shown in FIG. 1, a monocrystalline silicon wafer 11 is composed of a bulk portion 12 which is of low resistivity n-type material and a surface portion which includes a higher resistivity n-type region 14 which surrounds a localized high resistivity n-type region 18. Region 18 forms a substantially planar p-n+ junction with region 16. Region 16 also forms a substantially flat p-n junction 20A with the bulk portion 12 of the substrate and a curved edge portion 20B with the n-type region 14.

When the p-n junction formed by regions 16 and 18 is sufficiently reverse-biased avalanche breakdown operation is achieved. The breakdown normally tends to occur at the surface of the junction 22A or along the curved portion of the junction 22B. One reason for the undesired preferential breakdown at the surface is the effect of the discontinuity of the junction on electric field lines. Repeated breakdown at the surface 22A tends to damage the device and then degrade its performance. If the concentration of impurities at the junction surface 22A is significantly lowered, breakdown will tend to occur away from the surface along curved portion 22B or the relatively flat portion of the junction 22C, thereby avoiding such degradation of transistor performance.

Metal contact 24 is attached to region 18 which serves as the emitter. The epitaxial layer 14 serves as the collector. Metal contact 26 is attached to the n+—type region 28 which is surrounded by and in electrical contact with the epitaxial layer 14.

Figure 2A:
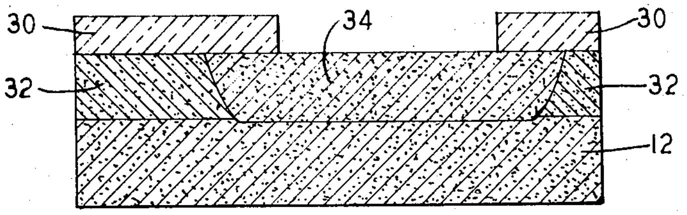
FIGS. 2A through 2D show the transistor of FIG. 1 in various stages of its manufacture.

In accordance with a preferred embodiment of the invention, a noncontacted base transistor of the kind shown in FIG. 1 may be made as follows. Referring to FIG. 2A, on one surface of a monocrystalline silicon wafer 12 in which arsenic is the predominant significant purity with a concentration of about $10^{18}$ atoms per cubic centimeter to result in an n+—type resistivity of about 0.03 ohm per square centimeter, there is grown, using conventional techniques, an epitaxial layer 32 about 2 microns thick in which arsenic is the predominant impurity with a concentration of about $10^{15}$ atoms per cubic centimeter to result in an n-type resistivity of about 0.5 ohm-centimeter. Next, using conventional techniques, an 8000 angstrom layer of oxide 30, typically silicon dioxide, is grown on top of the epitaxial layer 32 and then an aperture in the oxide is formed. Then, using well-known techniques, boron impurities are diffused through the entire aperture in the masking layer into the exposed central portion of the epitaxial layer down to and into the substrate. The boron impurities convert the diffused into region, which serves as the base 34 of the transistor, from n-type to p-type material. The p-type base diffusion 34 forms a p-n junction with the n+—type substrate 12 and the n-type epitaxial layer 32.

Normally, the lateral extent of diffusion of a p-n junction is about equal to its vertical extent; however, in this case, the lateral extent of the base was about 3 microns while the vertical extent was only about 2 microns. The increased lateral diffusion is achieved due to the fact that when the vertical base diffusion reaches the n+—type substrate the concentration of p-impurities is less than the concentration of n-impurities and therefore the vertical diffusion is effectively haulted while the lateral diffusion continues in the epitaxial layer.

Figure 2B:
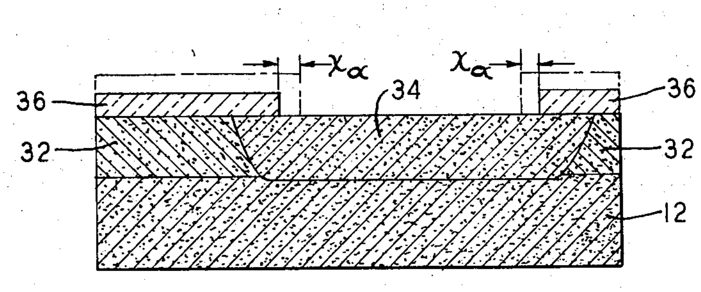

The wafer is then subjected to a buffered hydrofluoric etch solution which removes about 2,500 angstroms from the oxide layer and any impurities that may have formed over the exposed epitaxial region. As is apparent, the etch solution removes 2500 angstroms of the oxide layer from all exposed areas of the layer including the essentially vertical walls which define the aperture. The resulting structure is shown in FIG. 2B where the diameter of the aperture in the oxide mask 36 has been increased by an amount $2x_\alpha$.

Figure 2C:
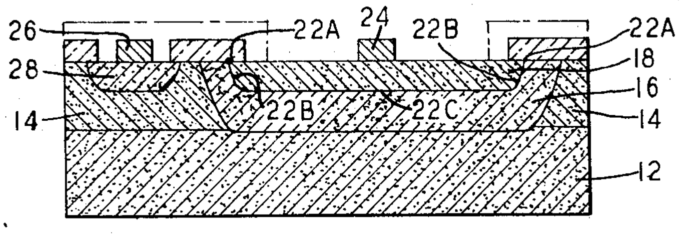

Referring now to FIG. 2C, a photoresist coating, typically KPR, is then placed over the entire wafer and using conventional techniques a second aperture in the oxide layer is formed exposing a second region in the epitaxial layer. The wafer is then placed in a phosphorus diffusion furnace where an n+—type acceptor impurity is diffused through both the enlarged first aperture and the second aperture to form n+—type regions 18 and 28. This diffusion converts region 18 of the p-type material to an n+—type emitter and region 28 of the n-type material epitaxial layer to an n+—type material region.

The base region 16 surrounds region 18 forming a p-n+ junction having a surface portion 22A, a curved portion 22B, and a relatively flat portion 22C. The n+—type region 28 was formed within the epitaxial layer 14 to provide a low resistivity surface on which to deposit a metal contact. Using conventional techniques, a metal contact 26 is formed on top of n+—type region 28 and another metal contact 24 is formed on top of n+—type region 18.

Figure 2D:
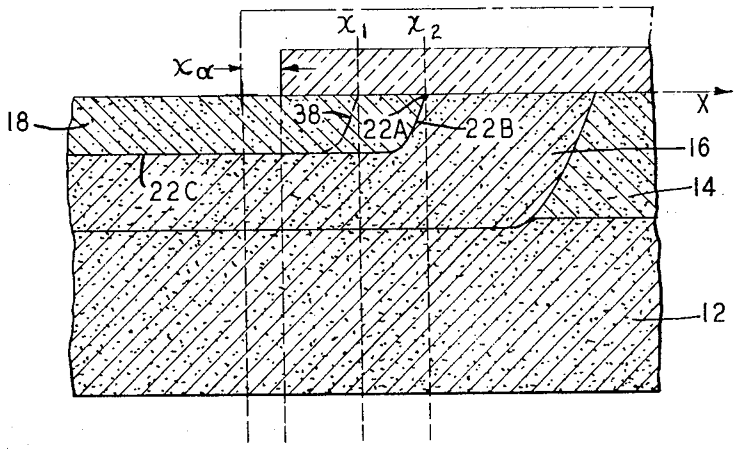

Now referring to FIG. 2D, there is shown an enlarged partial view of FIG. 2C. The amount of decrease in the edge of the aperture in the oxide mask is shown by $x_\alpha$. With the edge of the original aperture used as a reference point, the distance at which the surface portion of the emitter-base junction forms is shown as $x_2$. The distance at which the junction would have formed had the aperture not been increased prior to the emitter diffusion is shown as $x_1$ and the curve portion of the junction 38 is shown as a dashed line.

Figure 3:
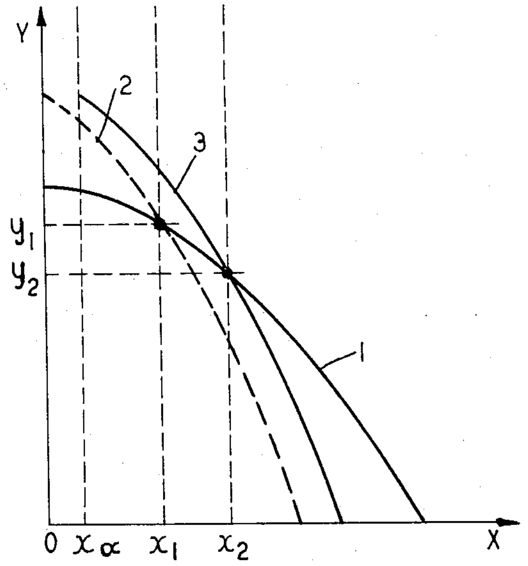
FIG. 3 illustrates a graph of surface impurity concentration as a function of distance.

Now referring to FIG. 3, there is illustrated a semilog plot of emitter and base surface impurity concentration as a function of distance from the original aperture edge in the +x direction. The point x = O corresponds to the edge of the original aperture prior to enlargement. Curve 1 is a plot of base surface impurity concentration as a function of distance from the reference point x = O. Dotted curve 2 is a hypothetical plot of emitter surface impurity concentration versus distance, assuming that the emitter and base diffusion were both diffused through the original unincreased aperture. Curve 3 is a plot of the actual emitter surface impurity concentration obtained when practicing the invention; that is, when the aperture is increased by an amount $x_\alpha$ (see FIG. 2D) prior to the emitter diffusion.

The value of the y coordinate, $y_1$, which is the intersection of curves 1 and 2, is the impurity concentration that would occur at the surface of a p-n junction formed by diffusing the base and emitter impurities through the original unincreased aperture. The value of impurity concentration along the flat bulk region of such a fabricated diode would be about equal to this surface value. As has been discussed, this is an undesirable situation since avalanche breakdown in this case will tend to occur along the surface of the p-n junction which degrades transistor performance. It is therefore desirable to reduce the surface concentration of impurities without affecting the bulk concentration so as to cause breakdown to occur below the surface.

Curve 3, which is a plot of the actual emitter surface impurity concentration versus distance the original aperture, is identical to curve 2 except that it is offset from curve 2 by an amount $x_\alpha$ . The amount of offset of curve 3 with respect to curve 2 is determined by moving curve 2 in the +x direction until it intersects curve 1 at y coordinate, $y_2$, which is at least 1 order of magnitude lower than $y_1$. The amount of the offset x 24 is the effective amount that the aperture must be increased before the emitter diffusion in order to lower the surface concentration of impurities of the resulting p-n junction to ensure that avalanche breakdown occurs below the surface of the junction.

The x coordinate of the intersection of curves 1 and 2, $x_1$, presents the lateral distance from the edge of the original aperture that the resulting surface region of the p-n junction would form if the emitter and base were diffused through the exact same aperture. TYe x coordinate of the intersection of curves 1 and 3, $x_2$, represents the distance from the edge of the original aperture where the surface region of the actual emitter-base junction formed. As is clear from the graph coordinate $x_2$ is more positive than coordinate $x_1$, therefore, the surface region of the p-n junction formed when the aperture is increased by an amount $x_\alpha$ prior to the emitter diffusion is located at a point along the surface of the transistor further from the original aperture edge and closer to the n-type epitaxial collector than would be the case if both the base and emitter diffusions were made through the same aperture. This decrease in distance between the emitter and collector tends to cause emitter-collector shorts which are very undesirable.

A solution to the problem of emitter-collector shorts is to increase the extent of the lateral diffusion of the base without changing the extent of the lateral diffusion of the emitter. An increased extent of the lateral diffusion of the base would provide a greater initial distance between the original unincreased aperture edge and the n-type epitaxial layer collector than normally occurs. This increased distance compensates for the increased extent of the lateral diffusion of the emitter caused by increasing the aperture prior to the emitter diffusion.

One conventional method used to increase the extent of the lateral diffusion of the base is to increase the extent of the vertical diffusion of the base since the extent of the lateral diffusion generally is directly proportional to the vertical diffusion. This method has the undesired effect of increasing the effective base width of the transistor and therefore limiting transistor parameters such as beta and base transit time.

Applicant has solved the problem of emitter-collector shorting by increasing the extent of the lateral diffusion of the base without increasing the effective base width of the transistor. This has been achieved, as explained in the discussion of FIG. 2A, by depositing on an n+—type substrate 12 an n-type epitaxial layer 32 and diffusing a p-type material base 34 completely through the epitaxial layer into the substrate. The resultant increase in the extent of the lateral diffusion of the base with no increase in the effective base width solves the problem of emitter-collector shorts without limiting transistor parameters.

It should be evident that the specific embodiment described is merely illustrative of the general principles of the invention and that various modifications are feasible without departing from the spirit and scope of the invention. For example, the base region may be made photosensitive so as to form a photoavalanche transistor. Additionally, materials other than those specifically mentioned obviously may be used instead. Further, the substrate may be used as the emitter and the n+ diffusion used as the collector.

I claim:

1. A process for producing an avalanche junction in a semiconductor device comprising the steps of:

masking all but a central portion of a relatively high resistivity semiconductive layer of one conductivity type;

diffusing into the central portion of the semiconductor layer a first impurity that converts the conductivity type of the diffused region;

substantially increasing the area of the central portion of the semiconductive layer by an effective amount to decrease the surface impurity concentration of a p-n junction formed by the diffusion of a second impurity into the central portion, such that avalanche breakdown of the p-n junction will occur below the planar surface;

diffusing into the increased exposed central portion of the semiconductive layer a second impurity that converts the conductivity type of a region within the first diffused region; and providing separate electrode connections to the diffused into exposed central portion and another portion of the semiconductive layer.

2. A process for producing an avalanche junction in a semiconductor device comprising the steps of:

forming on a low resistivity substrate of semiconductor material of one conductivity type a relatively high resistivity epitaxial layer of the same conductivity type;

forming over the epitaxial layer a masking layer;

forming an aperture in the masking layer, whereby a region of the epitaxial layer is exposed;

diffusing a first impurity through the aperture into the exposed epitaxial layer, whereby a first diffusion region of opposite conductivity of the original epitaxial layer is formed to a depth of the original substrate;

substantially increasing the lateral extent of the aperture in the masking layer by an effective amount to decrease the surface impurity concentration of a p-n junction formed by the diffusion of a second impurity through the aperture in the oxide mask, such that avalanche breakdown of the p-n junction occurs below the planar surface and does not degrade transistor performance; and diffusing an impurity through the increased aperture, whereby a second diffusion region of the same conductivity type as the substrate is formed.

3. A method for producing an avalanche junction in a semiconductor device comprising the steps of:

forming a relatively low resistivity substrate of semiconductor material of one conductivity type a relatively high resistivity epitaxial layer of the same conductivity type;

forming over the epitaxial layer a masking layer;

forming a first aperture in the masking layer, whereby a first region of the epitaxial layer is exposed;

diffusing an impurity through the entire first aperture into the first exposed epitaxial region, whereby a first diffused region is formed that extends to a depth of the substrate and is of opposite conductivity of the epitaxial layer;

substantially increasing the lateral extent of the first aperture by an effective amount to decrease the surface impurity concentration of a p-n junction formed by the diffusion of the second impurity through the aperture in the mask, such that avalanche breakdown of the p-n junction occurs below the planar surface and does not degrade transistor performance;

forming a second aperture in the masking layer, whereby a region of the epitaxial layer other than the first diffused region is exposed;

diffusing an impurity into the entire areas of the two apertures, whereby a second diffusion of opposite conductivity to the first diffusion region is formed within the first diffusion region and the epitaxial region below the second aperture is converted from relative high resistivity material to relatively low resistivity material; and making separate transparent connections to both of the exposed regions of the epitaxial layer.

4. A method for producing an avalanche junction in a planar semiconductor device comprising the steps of:

masking all but a central portion of a sample of semiconductive material of one conductivity type;

diffusing into the central portion of the semiconductor material a first impurity that converts the conductivity type of the diffused region;

substantially increasing the lateral extent of the exposed central portion of the semiconductive layer by an effective amount to decrease the surface impurity concentration of a p-n junction formed by the diffusion of a second impurity into the central portion of the semiconductive material such that avalanche breakdown of the p-n junction occurs below the planar surface; and diffusing into the increased central portion of the semiconductive material a second impurity that converts the conductivity type of a region within the diffused region.

* * * * *